(12) United States Patent
Lin et al.

(10) Patent No.: US 11,481,998 B2
(45) Date of Patent: Oct. 25, 2022

(54) BUILDING FOOTPRINT GENERATION BY USING CLEAN MASK GENERATION AND RECEIVED IMAGE DATA

(71) Applicant: GENERAL ELECTRIC COMPANY, Schenectady, NY (US)

(72) Inventors: Yen-Liang Lin, Niskayuna, NY (US); Walter V. Dixon, III, Duanesburg, NY (US); James Vradenburg Miller, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 226 days.

(21) Appl. No.: 16/590,917

(22) Filed: Oct. 2, 2019

(65) Prior Publication Data

US 2021/0103726 A1 Apr. 8, 2021

(51) Int. Cl.
*G06K 9/00* (2022.01)
*G06V 20/10* (2022.01)
(Continued)

(52) U.S. Cl.
CPC .......... *G06V 20/176* (2022.01); *G01C 21/32* (2013.01); *G06F 30/13* (2020.01); *G06K 9/6215* (2013.01); *G06T 15/005* (2013.01); *G06T 17/05* (2013.01)

(58) Field of Classification Search
CPC . G06T 7/11; G06T 2207/20084; G06T 17/05; G06T 2207/20081; G06T 7/00;
(Continued)

(56) References Cited

U.S. PATENT DOCUMENTS 6,985,929 B1 * 1/2006 Wilson ................ G06F 16/9537
709/217
7,324,666 B2 1/2008 Zoken et al.
(Continued)

OTHER PUBLICATIONS

Qin et al., "A Hierarchical Building Detection Method for Very High Resolution Remotely Sensed Images Combined with DSM Using Graph Cut Optimization", Photogrammetric Engineering & Remote Sensing vol. 80, No. 9, Sep. 2014, pp. 873-883.*
(Continued)

*Primary Examiner* — Guillermo M Rivera-Martinez
(74) *Attorney, Agent, or Firm* — Buckley, Maschoff & Talwalkar LLC (57) ABSTRACT

According to some embodiments, a system, method and non-transitory computer-readable medium are provided comprising an image data source storing image data from a plurality of images; a height map source storing height maps for an area of interest (AOI); a building footprint module; a memory; and a building footprint processor, operative to execute the program instructions to: receive image data for an AOI; receive a height map for the AOI; execute a building segmentation module to generate a building mask that indicates a presence of one or more buildings in the AOI; apply at least one clean mask process to the generated building mask to generate a clean mask; receive the clean mask at an instance building segmentation module; and execute the instance building segmentation module to generate at least one building footprint based on the clean mask and the received image data. Numerous other aspects are provided.

20 Claims, 7 Drawing Sheets

(51) Int. Cl.
  *G01C 21/32* (2006.01)
  *G06T 17/05* (2011.01)
  *G06T 15/00* (2011.01)
  *G06K 9/62* (2022.01)
  *G06F 30/13* (2020.01)

(58) Field of Classification Search
  CPC .... G06T 7/62; G06K 9/00637; G06K 9/0063; G06K 9/3233; G06K 9/00228
  See application file for complete search history.

(56) References Cited

U.S. PATENT DOCUMENTS

| | | | |
|---|---|---|---|
| 9,639,757 B2 | 5/2017 | Du et al. | |
| 10,041,807 B2 | 8/2018 | Ren et al. | |
| 10,108,755 B2 | 10/2018 | Flynn et al. | |
| 11,308,714 B1* | 4/2022 | Christoudias | G06K 9/6267 |
| 2003/0225513 A1* | 12/2003 | Gagvani | G06T 15/04 |
| | | | 340/995.14 |
| 2008/0021683 A1* | 1/2008 | Rahmes | G06K 9/00637 |
| | | | 703/7 |
| 2013/0077819 A1* | 3/2013 | Du | G06K 9/4661 |
| | | | 382/103 |
| 2013/0083015 A1* | 4/2013 | Hernandez Esteban | |
| | | | G06T 15/00 |
| | | | 345/419 |
| 2013/0343612 A1* | 12/2013 | Buch | G06K 9/00704 |
| | | | 382/106 |
| 2017/0076304 A1 | 3/2017 | Toth et al. | |
| 2017/0076438 A1* | 3/2017 | Kottenstette | G06K 9/627 |
| 2017/0084077 A1* | 3/2017 | Liu | G06T 17/05 |
| 2018/0075319 A1* | 3/2018 | Xu | G06K 9/00637 |
| 2019/0019324 A1* | 1/2019 | Wu | G06T 15/04 |
| 2019/0122432 A1 | 4/2019 | Howard et al. | |
| 2019/0188516 A1* | 6/2019 | Porter | G06V 10/56 |

OTHER PUBLICATIONS

Zhao et al., "Building Extraction from Satellite Images Using Mask R-CNN with Building Boundary Regularization", 2018 IEEE/CVF Conference on Computer Vision and Pattern Recognition Workshops (CVPRW), 2018, pp. 242-246.*

Kim et al., "Semiautomatic Reconstruction of Building Height and Footprints from Single Satellite Images", 2007 IEEE International Geoscience and Remote Sensing Symposium, pp. 4737-4740, Barcelona, 2007.

Chawda et al., "Extracting Building Footprints from Satellite Images using Convolutional Neural Networks", 2018 International Conference on Advances in Computing, Communications and Informatics (ICACCI), pp. 572-577, Bangalore, 2018.

* cited by examiner

BUILDING FOOTPRINT GENERATION BY USING CLEAN MASK GENERATION AND RECEIVED IMAGE DATA

GOVERNMENT SUPPORT

This invention was made with government support under D17PC00287 awarded by the U.S. Department of Interior, and supported by the Office of the Director of National Intelligence (ODNI), Intelligence Advanced Research Projects Activity (IARPA). The government has certain rights in the invention.

BACKGROUND

In computer graphics, accounting for Level of Detail (LOD) involves decreasing the complexity of a 3D model representation of an object(s) as it moves away from the viewer or according to other metrics such as object importance, viewpoint-relative speed or position. Often, LOD is applied to geometry detail. For example, aerial images and satellite images may both provide a view of the Earth from above, and the images may provide a particular LOD. Understanding the images may be important for the task of automated monitoring in various sensing applications. Conventional techniques for analyzing the images may not have a high level of accuracy in even the lowest LOD for a given object, due to occlusions or difficulty in distinguishing between boundaries of the given object and nearby vegetation.

It would be desirable to provide systems and methods to improve analysis of aerial images and satellite images, including distinguishing different objects in the images, in an automatic and accurate manner.

SUMMARY

According to some embodiments, a system includes an image data source storing image data from a plurality of images; a height map source storing height maps for an area of interest; a building footprint module; a memory storing program instructions; and a building footprint processor, coupled to the memory, and in communication with the building footprint module and operative to execute the program instructions to: receive image data for an area of interest (AOI); receive a height map for the AOI; execute a building segmentation module to generate a building mask that indicates a presence of one or more buildings in the AOI; apply at least one clean mask process to the generated building mask to generate a clean mask; receive the clean mask at an instance building segmentation module; and execute the instance building segmentation module to generate at least one building footprint based on the clean mask and the received image data According to some embodiments, a computer-implemented method includes receiving multi-spectral image data for an area of interest (AOI); receiving a height map for the AOI; executing a building segmentation module to generate a building mask that indicates a presence of one or more buildings in the AOI; applying at least one clean mask process to the generated building mask to generate a clean mask; receiving the clean mask at an instance building segmentation module; and executing the instance building segmentation module to generate at least one building footprint based on the clean mask and the received image data.

According to some embodiments, a non-transitory computer-readable medium storing instructions that, when executed by a computer processor, cause the computer processor to perform a method including receiving multi-spectral image data for an area of interest (AOI); receiving a height map for the AOI; executing a building segmentation module to generate a building mask that indicates a presence of one or more buildings in the AOI; applying at least one clean mask process to the generated building mask to generate a clean mask; receiving the clean mask at an instance building segmentation module; and executing the instance building segmentation module to generate at least one building footprint based on the clean mask and the received image data.

Some technical effects of some embodiments disclosed herein are improved systems and methods to automatically uniquely identify and label each building that is in a given Area of Interest (AOI). The building footprint module may, in some embodiments, capture each building in the AOI as a distinct entity. One or more embodiments localize a building footprint on at least one of satellite and aerial images, using a multi-spectral (e.g., color) image and height data. As used herein, "building footprint" refers to the ground area on a site that is used by the building structure and is defined by the perimeter of the building on the ground area. Embodiments may accurately localize very small and complex-shaped building footprints. In one or more embodiments, the building footprint module may perform a building segmentation and then an instance segmentation. The building segmentation may, in one or more embodiments, use the multi-spectral image and height map as input, and generate a binary building mask, where each pixel in the building mask represents either a building or not a building. Then the instance segmentation may use the multi-spectral image and the building mask as input and generate labeled building masks, which may separate one building noted in the building mask into different buildings and assign a building ID for each building.

With this and other advantages and features that will become hereinafter apparent, a more complete understanding of the nature of the invention can be obtained by referring to the following detailed description and to the drawings appended hereto.

Other embodiments are associated with systems and/or computer-readable medium storing instructions to perform any of the methods described herein.

DETAILED DESCRIPTION

In the following detailed description, numerous specific details are set forth in order to provide a thorough understanding of embodiments. However, it will be understood by those of ordinary skill in the art that the embodiments may be practiced without these specific details. In other instances, well-known methods, procedures, components and circuits have not been described in detail so as not to obscure the embodiments.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Aerial and satellite images of views of the Earth from above may provide a particular LOD for different objects on Earth's surface, such as buildings. The LOD may indicate how many details of the building are provided. As a non-exhaustive example, an LOD 0 may properly identify the building footprint; an LOD 1 may combine the footprint with a height estimation of the building, and may be visible as a block; LOD 2 may show gabled surfaces to represent, for example, a house with a sloped roof, . . . the highest LOD may show dormers, porches, etc. The information provided by the different LOD levels may be used for different purposes. As a non-exhaustive example, LOD 0 information may be used to indicate the square footage of a structure, indicate the locations of these buildings to ensure appropriate permits, etc.; LOD 1 information may allow for the modeling of a building with higher levels of detail. It may be difficult to obtain a desired LOD accurately for a building, as there may be occlusions in the images and/or it may be difficult to distinguish a building/structure from another building/structure and/or nearby vegetation, etc.

It may be desirable to accurately segment out a building from the images such that analytics may understand information about building size and/or automatically model the building. A first step in this process may be to automatically identify the footprint of the building, as described further below in one or more embodiments.

The building footprint may be used by other systems in at least one of military planning purposes, humanitarian needs, and to provide a 3D model of the area. Conventionally, a 3D model of an area may be manually constructed, but this takes a lot of time. With the more efficient building footprint provided by one or more embodiments, a 3D model may be produced more accurately within a few hours.

In one or more embodiments, the building footprint module may receive a color image of an area of interest, and a height map for that same area of interest. The height map is a map of surface elevations in the area of interest. The building footprint module may then apply the building segmentation process, which uses the color image and the height map to generate a pixel-by-pixel building mask. Each pixel in the building mask indicates one of 1. the presence of a building ("building"), or 2. absence of a building ("no building"). Next, one or more post processing steps may be applied to the building mask to generate a more accurate building mask, which may be referred to herein as a "clean mask". For example, a vegetation index may be applied to confirm that none of the pixels marked as "building" are actually vegetation, and/or a small hole removal filter may be used to remove any holes in the mask that are not marked as either building or not building, by assigning the pixel to be one of building or not building, as appropriate. It is noted that at the pixel level, the mask may contain small imperfections that may be corrected by looking at the neighboring pixel area. The building footprint module may then apply an instance building segmentation process to the clean mask and the color images. The building segmentation process may apply a direction process and a distance process to the combination of the building perimeters from the clean mask and the color images to generate a building footprint, that identifies unique building instances.

Figure 1:
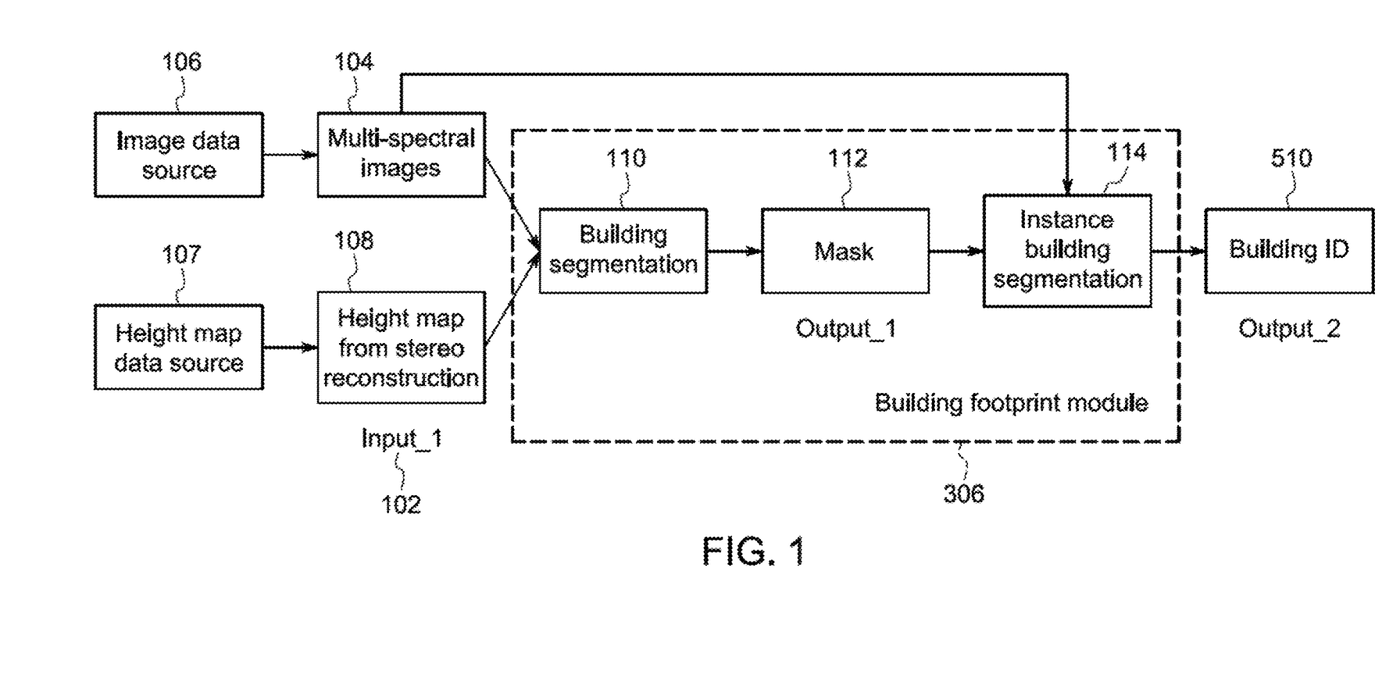
FIG. 1 is a block diagram of a system according to some embodiments.
Figure 2:
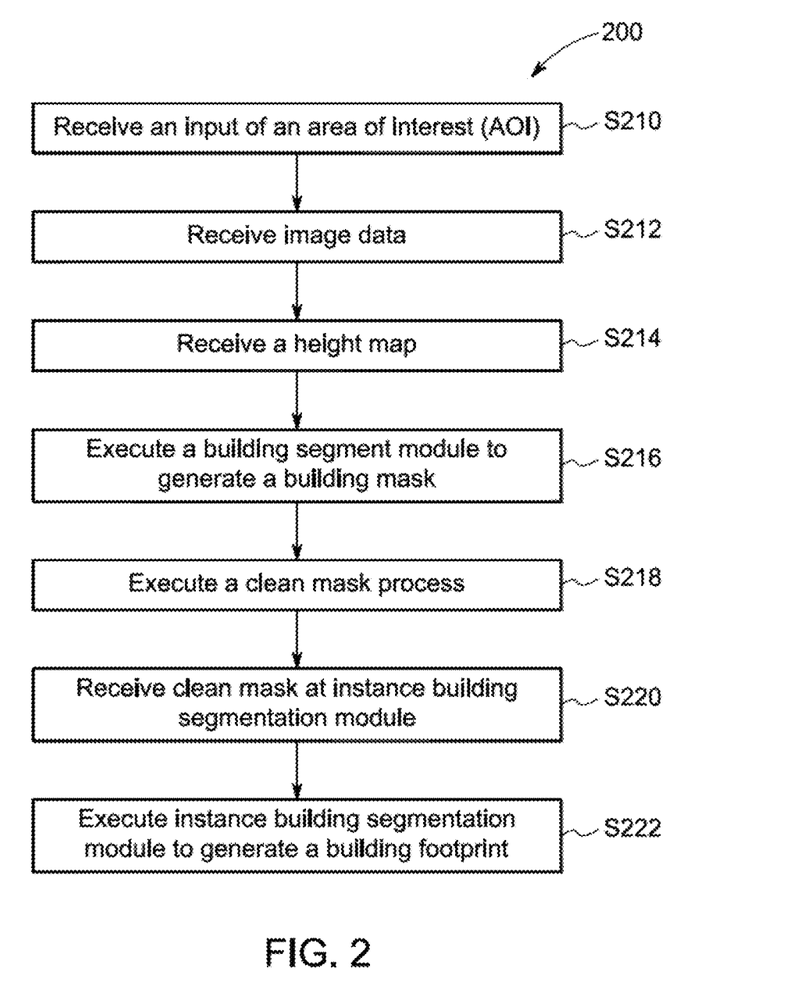
FIG. 2 is a method according to some embodiments.

Turning to FIGS. 1-6, a system 100/300 and diagrams of examples of operation according to some embodiments are provided. In particular, FIG. 2 provides a flow diagram of a process 200, according to some embodiments. Process 200, and any other process described herein, may be performed using any suitable combination of hardware (e.g., circuit(s)), software or manual means. For example, a computer-readable storage medium may store thereon instructions that when executed by a machine result in performance according to any of the embodiments described herein. In one or more embodiments, the system 100/300 is conditioned to perform the process 200 such that the system is a special-purpose element configured to perform operations not performable by a general-purpose computer or device. Software embodying these processes may be stored by any non-transitory tangible medium including a fixed disk, a floppy disk, a CD, a DVD, a Flash drive, or a magnetic tape. Examples of these processes will be described below with respect to embodiments of the system, but embodiments are not limited thereto. The flow charts described herein do not imply a fixed order to the steps, and embodiments of the present invention may be practiced in any order that is practicable.

Figure 3:
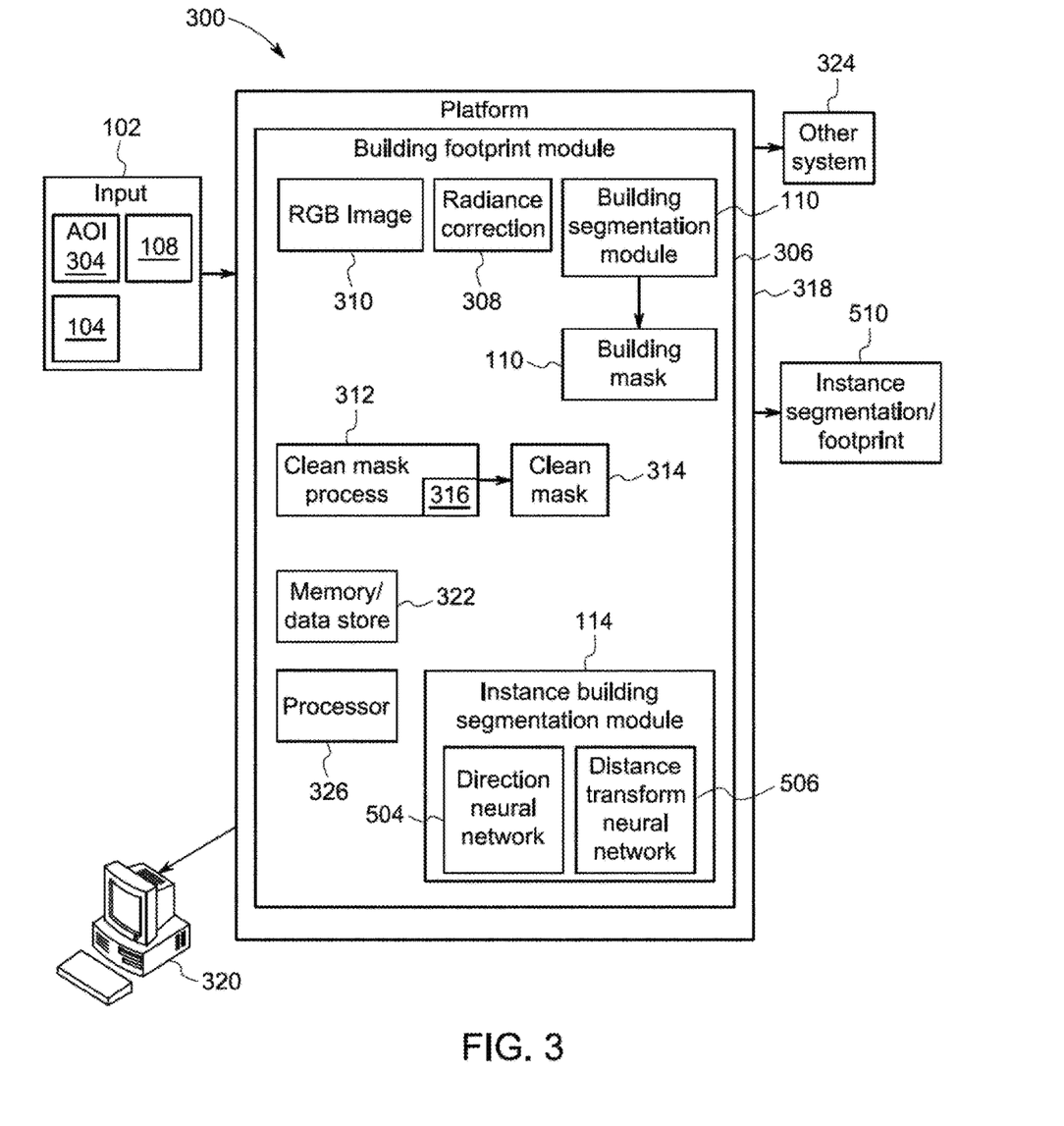
FIG. 3 is high-level block diagram of a system that may be provided in accordance with some embodiments.
Figure 4:
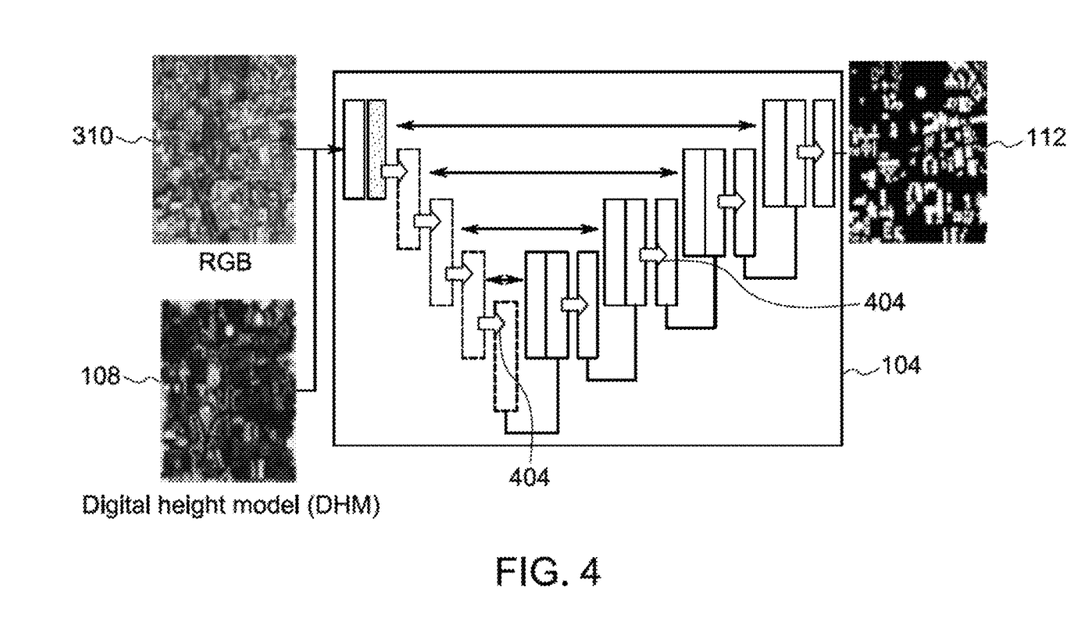
FIG. 4 is a block diagram of the building segmentation process according to some embodiments.

Initially, at S210, an input 102 of an area of interest (AOI) 304 is received. The AOI 304 may be the area where the locations of buildings may be determined by the processes described herein. As used herein, the term "building" may refer to any structure supporting a roof, including but not limited to a house, breezeway, school, store, factory, office building. The AOI input may be in the form of an address, geographical coordinates of latitude and longitude, or any other suitable identifier. The AOI 304 may include a bounded region about a particular address or point. As a non-exhaustive example, the AOI 304 may cover a square kilometer, twenty-five square kilometers or any other suitable region.

Then in S212, image data 104 for the AOI is received. The image data 104 may be received from an imagery data source 106. The image data 104 may be received by a building footprint module 306 in one or more embodiments. The image data 104 may be aerial images or satellite images acquired over multiple time points (e.g., days). It is noted that the satellite images may be acquired from different points in time, as the images are taken by a satellite in orbit. It is also noted that since the images are acquired at different points in time by orbiting satellites, the images may be taken at different positions. The image data 104 may be provided by one or more different image providers, and may be provided in different forms. As a non-exhaustive example, the image data 104 may be multiple panchromatic satellite images, which may be in grey-scale in high resolution and/or multispectral georeferenced satellite images ("multi-spectral images"). It is noted that the satellites may acquire the image data in real time, but may have to hold the data until a communication link may be established to a ground station, or a communication link may be established to another satellite with a link to a ground station. As such, the images may be archived and presented in a catalog indexed by date/time and coverage area, and may therefore be referred to as a "historical" set of images. In some embodiments, the real time images may also be communicated to the ground station as they are received by satellite, without being held. It is noted that multispectral images, which capture image data within specific wavelength ranges across the electromagnetic spectrum, may provide for the wavelengths to be separated by filters or the use of other tools that are sensitive to particular wavelengths. Typically, multispectral images include 4 or 8 sets of wavelengths. Of these available wavelengths, one or more embodiments may provide for red wavelengths, green wavelengths and blue wavelengths to be extracted, such that an initial red-green-blue (RGB) image is generated. It is noted that the RGB image is constructed in a process referred to as pan sharpening. This pan sharpening process may include taking high-resolution intensity data from a panchromatic image and mapping in the lower resolution color information in an orthogonal space. It is noted that in embodiments, an infrared wavelength may also be extracted, as may any other suitable wavelengths. It is further noted that while the embodiments described herein use an RGB image, other bands, including all of the bands, may be extracted to create the image (e.g., near-infra-red, red, green, etc.). In one or more embodiments, the building footprint module 306 may apply a series of radiance corrections 308 to the initial RGB image to generate a radiance-corrected RGB image 310 ("RGB image") with a more accurate color scheme. For example, as the images are taken by satellite at different angles and positions, and the energy sensors onboard satellites record data that may differ from actual energy emitted or reflected from a surface on Earth, the image may have some inaccuracies. Any suitable radiance correction process may be used.

Next, in S214, a height map/model 108 for the AOI 304 is received at the building footprint module 306 from a height map source 107. As used herein, the terms "height map" and "height model" may be used interchangeably. In one or more embodiments, the height map 108 may be generated from the corresponding panchromatic satellite images for the same AOI. It is noted that the height map may be generated from multi-spectral images. The building footprint module 306 may use any suitable height map process using a multi-view stereo reconstruction process to construct a 3D digital height model (DHM) 108. In one or more embodiments, the digital height model 108 may be a dense height estimation of the AOI pixel-by-pixel, where each pixel includes an estimate of height in the AOL. In one or more embodiments, the height map may be constructed from any 2.5 or 3D scanning modality (e.g., LiDAR, SAR, etc.).

In one or more embodiments, a building segmentation module 110 of the building footprint module 306 may be executed to generate a building mask 112 in S216. The building segmentation module 110 may receive the RGB image 310 and the DHM 108 as inputs. In one or more embodiments, the building segmentation module 110 may apply machine learning in the form of a deep learning neural network 402 (FIG. 4) having multiple layers. Any suitable deep learning neural network may be used. Prior to the process 200 described herein, the deep learning neural network 402 was trained to learn the wavelengths (red wavelengths, green wavelengths, blue wavelengths) in a height channel that indicate a building. The deep learning neural network 402 was trained on a collection of ground truth data of color images and height maps that represent buildings. In one or more embodiments, the deep learning neural network 402 may execute one or more convolutions 404 (FIG. 4) to extract and learn the context of the received RGB image 310 and DHM 108 to generate the building mask 112. The building mask 112 may be a binary label, where every pixel is assigned a "1" or a "0" and one of those assigned numbers indicates the presence of a building and the other number indicates the absence of a building. For example, for every pixel with a "1", a building is present, and for every pixel with a "0", a building is absent.

In S218 at least one clean mask process 312 is executed. In one or more embodiments, the clean mask process 312 may be applied to the building mask 112 to generate a clean mask 314. In the clean mask process 312 relatively small areas (e.g., holes/incomplete spots) on the building mask 112 may be removed/resolved via any suitable morphological application that modifies the image (e.g., grow/shrink boundaries or regions of an image), small object removal filter and small hole removal filter. It is noted that the small object removal filter and the small hole removal filters examine the connected components of pixel that then apply an area threshold to the identified group of pixels to modify the image. In one or more embodiments, the clean mask process 312 may also apply any suitable spectral index 316 to the building mask to eliminate objects that are marked as a building, but are likely not a building. As a non-exhaustive example, a vegetation spectral index may analyze the ratio of red wavelengths, green wavelengths, and infrared wavelengths in the RGB image to predict what is likely vegetation. When an object is marked in the building mask 112 (via assigned pixels) as a building, but that same area is predicted to be vegetation via the vegetation spectral index, the clean mask process 312 may change the pixel assignment for that area, and/or the area may be subject to further analysis, after which the pixel assignment may change or remain unchanged. As another non-exhaustive example, the clean mask process 312 may apply other geometric constraints (e.g., aspect ratio) based on knowledge of probable building constructions to possibly change the pixel assignment for that area. Other suitable mask clean processes 312 may be used.

Next, in S220, the clean mask 314 is received at an instance building segmentation module 114 of the building footprint module 306. In one or more embodiments, the instance building segmentation module 114 may identify multiple buildings (e.g., instance segmentation) in an area of the clean mask that denotes a single building. The instance building segmentation module 114 may identify and/or predict the separation of multiple uniquely identified building footprints from an area of the clean mask that denotes a single building. In one or more embodiments, these uniquely identified building footprints may each be assigned a number or other identifier. As a non-exhaustive example, two adjacent buildings may not be segmented in the clean mask as two buildings, as there is some portion of the clean mask that connects them (e.g., the buildings may be connected by a breezeway, etc.).

Figure 5:
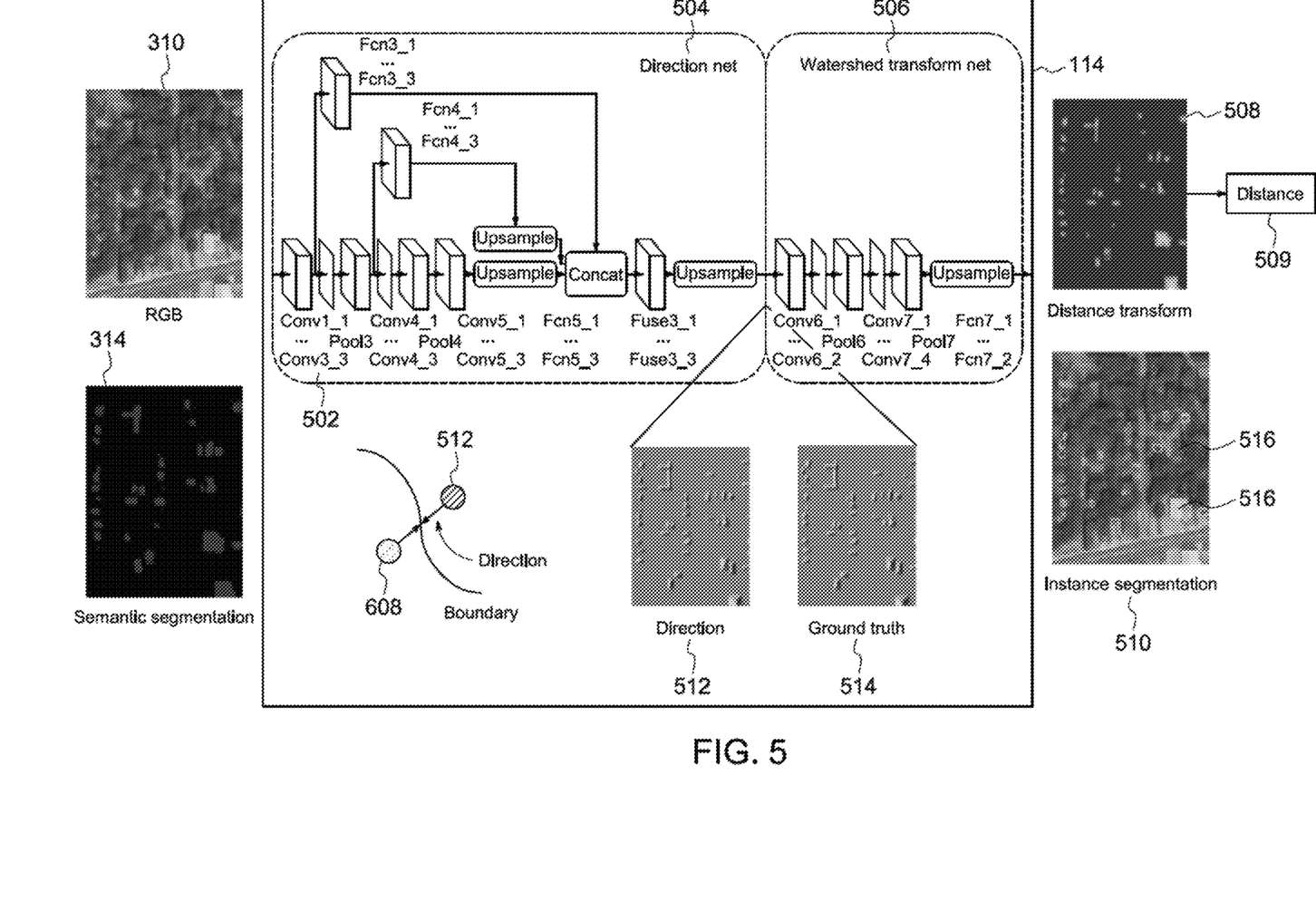
FIG. 5 is a block diagram of the instance segmentation process according to some embodiments.

In one or more embodiments, the instance building segmentation module 114 may predict the boundaries between buildings in clean masks 314. It is noted that if the building pixels are separated by a significant distance it may be easy for the instance building segmentation module 114 to determine the one or more building footprints 510.

The instance building segmentation module 225 is executed in S222 to generate one or more building footprints 510.

Figure 6:
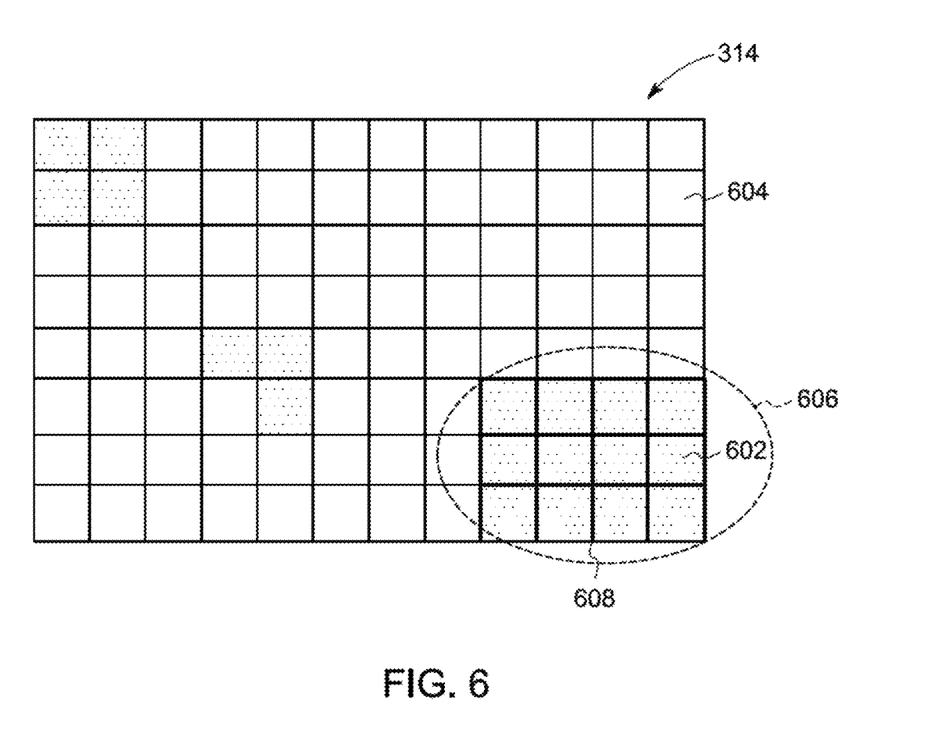
FIG. 6 is a clean mask according to some embodiments.

As shown in FIG. 6, the semantic segmentation block shows the clean mask 314 identifying "building" pixels 602 and "no building" pixels 604, where the building pixels 602 are shaded. In one or more embodiments, groups 606 of adjacent "building" pixels may denote at least one building. The "building" pixel group 606 may include one or more pixels. The "building" pixel groups 606 may be separated by one or more "no-building" pixels 604. The outer edges 608 of the building pixel group 606 may indicate an edge or boundary of at least one building. When one building is adjacent to another building, they may not appear to be separated in the clean mask 314. In one or more embodiments, when the clean mask 314 is combined with the color information from the RGB image 310, the instance building segmentation module 114 may separate two or more adjacent structures from the mask, using a direction neural network 504 (FIG. 5) and a distance neural network 506 (FIG. 5) included in the instance building segmentation module 114. As described above with respect to the deep learning neural network 402, each of the direction neural network 504 and the distance transform neural network 506 may be convolutional neural networks, and may execute one or more convolutions 502 (FIG. 5) to generate a distance transform and an instance segmentation.

In one or more embodiments, prior to execution of this process 200, the instance building segmentation module 114 learned colors in the context of particular building shapes, or other building features (e.g., contour), to predict whether there are one or more structures in a clean mask.

As part of the execution of the instance building segmentation module 114, in one or more embodiments, the direction neural network 504 may receive the clean mask 314 and the RGB image 310. Prior to the process 200, the direction neural network 504 is trained to predict a unit vector (e.g., direction 512) for each pixel in the segmentation pointing away from the nearest boundary/perimeter/building edge 608 from any point within the clean mask 314. As shown in FIG. 5, the direction 512 may be represented as a direction mask. The direction mask indicates the direction. In particular, in embodiments, the direction mask provides a vector for each of the pixels in the segmentation that indicates the direction of the nearest boundary (either by pointing toward or away from the closes edge). The non-exhaustive examples shown herein have the direction pointing away from the boundary. The data used to train the direction neural network 504 may include ground truth information 514 for buildings having similar building attributes (e.g., shape, contour, etc.), and a labeled direction to an edge of the building. It is noted that the training data for the direction neural network may also come from simulation (e.g., random building footprints may be generated, and then the corresponding direction information may be generated to train the network on). In one or more embodiments, the direction neural network 504 applies its training data to the identified "building" pixel groups 606 and determines a direction 512 to the building edge 608 from each pixel within the group.

Then, then distance transform neural network 506 receives the direction 512 to the building edge 608 for each pixel within the group. In one or more embodiments, the distance transform neural network 506 infers a distance to the building edge 608. Prior to the process 200, the distance neural network 506 is trained to predict a distance 509 of a boundary/perimeter/building edge 608 from any point within the clean mask. In one or more embodiments, the training data includes may examples of how to predict the separation of buildings. From that training data, the distance transform neural network 506 may predict when there is more than one building in the building pixel group 606, and then based on the determination of separate buildings, determine a predicted distance to the boundary/perimeter/building edge from any point within the clean mask. It is noted that the distance transform neural network 506 may predict at least one of a distance to the edge from any point, and a distance from the edge to any point. It is noted that the direction neural network 504 and the distance neural network 506 may be repeated for each building pixel group 606 in the clean mask 314.

In one or more embodiments, the instance building segmentation module 114 uses the direction 512 to the edge 608 for a given pixel and the distance 509 to the edge 608 for the same pixel to determine how to separate the building pixel group 606 into two or more building footprints. The instance building segmentation module 114 outputs where to separate the building pixel group 606 into two or more building footprints, when it is determined two or more building footprints exist in the given building pixel group.

Next, the instance building segmentation module 114 inserts the determination of where to separate the building pixel group 606 into the RGB image 310 to output a unique outline/boundary ("footprint"/"instance segmentation") 510 of the defined building footprints in the AOL. As used herein, "instance segmentation" may refer to the building footprints, where each building footprint is uniquely identified with an assigned building identifier 516 (e.g., unique number or value). The image shown in 510 may be a visualization of the instance segmentation that combines the RGB image with the building identifiers 516. Then, in one or more embodiments, a building identifier 516 may be assigned to each footprint 510.

Following the generation of the one or more building footprints, the building footprint(s) may be transmitted to one or more other systems for further processing. The further processing may include, but is not limited to: determining how many square feet a building has; creating a model of the building; determining permit availability for any of the buildings; determining how the building footprint has changed from a historical building footprint.

It is noted that metrics may, in embodiments, be applied to the generated building footprints to verify how correct the results are. This accuracy process may involve a curated set of ground-truth measurements, that may be used to score the quality of the automated instance segmentation process. There may be a variety of metrics that capture different aspects of the footprint: Recall, Precision, Intersection over Union (IOU), F-Score, etc.

FIG. 3 is a block diagram of system architecture 300 according to some embodiments. Embodiments are not limited to architecture 300.

Architecture 300 includes a platform 318, a building footprint module 306, a user platform 320, a data store 322 (e.g., database). In one or more embodiments, the building footprint module 306 may reside on the platform 320. Platform 320 provides any suitable interfaces through which users/other systems 324 may communicate with the building footprint module 306.

In one or more embodiments, the output of the building footprint module 306 may be output to a user platform 320 (a control system, a desktop computer, a laptop computer, a personal digital assistant, a tablet, a smartphone, etc.) to view information about the building footprints in an AOL. In one or more embodiments, the output from the building footprint module 306 may be transmitted to various user platforms or to other system (324), as appropriate (e.g., for display to, and manipulation by, a user, further analysis and manipulation).

In one or more embodiments, the system 300 may include one or more processing elements 326 and a memory/computer data store 322. The processor 326 may, for example, be a microprocessor, and may operate to control the overall functioning of the building footprint module 306. In one or more embodiments, the building footprint module 306 may include a communication controller for allowing the processor 326 and hence the building footprint module 306, to engage in communication over data networks with other devices (e.g., user interface 320 and other system 324).

In one or more embodiments, the system 300 may include one or more memory and/or data storage devices 322 that store data that may be used by the module. The data stored in the data store 322 may be received from disparate hardware and software systems, some of which are not inter-operational with one another. The systems may comprise a back-end data environment employed by a business, industrial or personal context.

In one or more embodiments, the data store 322 may comprise any combination of one or more of a hard disk drive, RAM (random access memory), ROM (read only memory), flash memory, etc. The memory/data storage devices 322 may store software that programs the processor 326 and the building footprint module 306 to perform functionality as described herein.

As used herein, devices, including those associated with the system 300 and any other devices described herein, may exchange information and transfer input and output ("communication") via any number of different systems. For example, wide area networks (WANs) and/or local area networks (LANs) may enable devices in the system to communicate with each other. In some embodiments, communication may be via the Internet, including a global internetwork formed by logical and physical connections between multiple WANs and/or LANs. Alternately, or additionally, communication may be via one or more telephone networks, cellular networks, a fiber-optic network, a satellite network, an infrared network, a radio frequency network, any other type of network that may be used to transmit information between devices, and/or one or more wired and/or wireless networks such as, but not limited to Bluetooth access points, wireless access points, IP-based networks, or the like. Communication may also be via servers that enable one type of network to interface with another type of network. Moreover, communication between any of the depicted devices may proceed over any one or more currently or hereafter-known transmission protocols, such as Asynchronous Transfer Mode (ATM), Internet Protocol (IP), Hypertext Transfer Protocol (HTTP) and Wireless Application Protocol (WAP).

Figure 7:
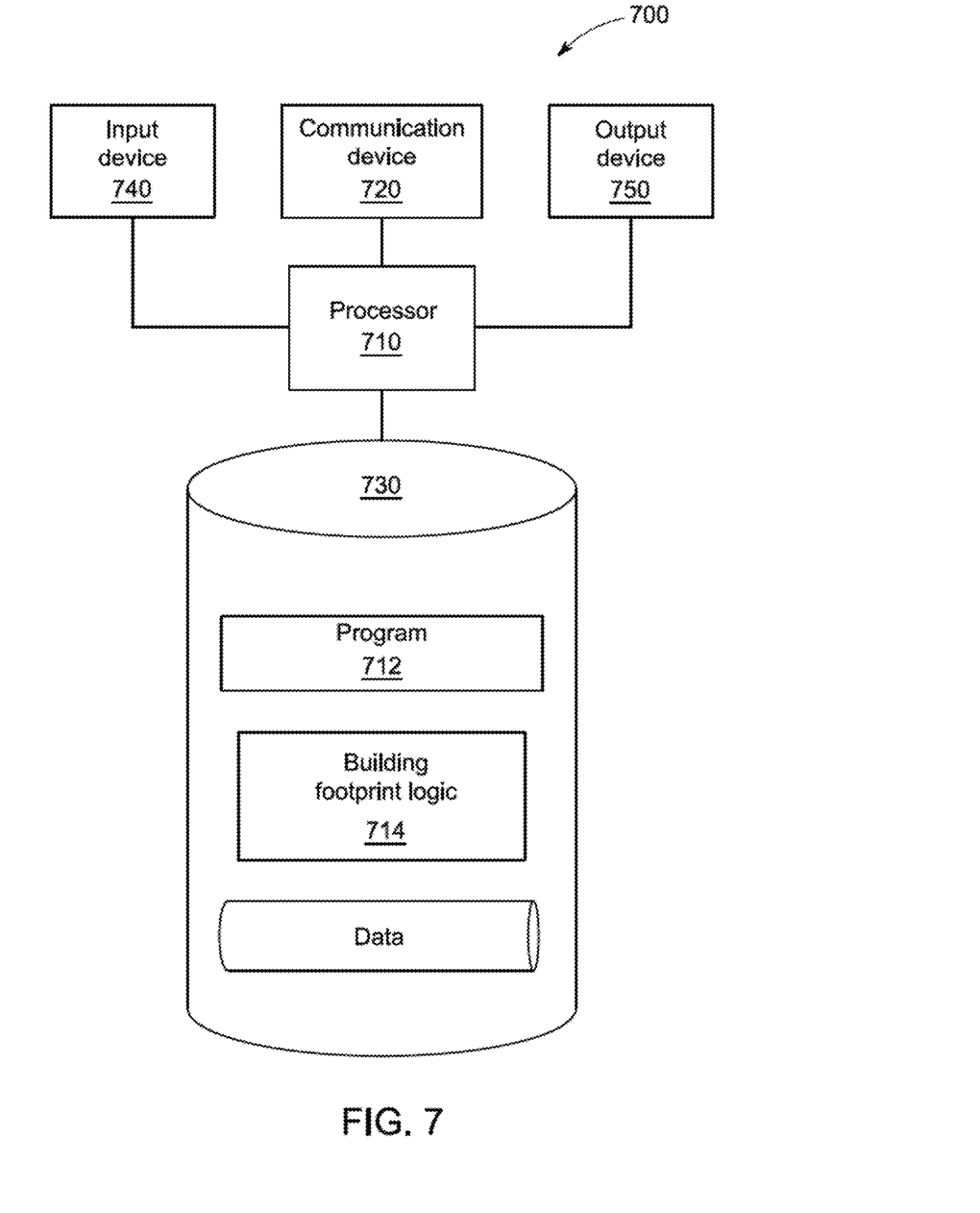
FIG. 7 is a block diagram of a building footprint platform according to some embodiments of the present invention.

The embodiments described herein may be implemented using any number of different hardware configurations. For example, FIG. 7 is a block diagram of a building footprint platform 700 that may be, for example, associated with the system 300 of FIG. 3. The building footprint platform 700 may be implemented using any architecture that is or becomes known, including but not limited to distributed, on-premise, cloud-based and hybrid architectures, as well as embedded in another system. Embodiments are not limited to the building footprint platform 700. The building footprint platform 700 may be a database node, a server, a cloud platform, a user device, or the like. The building footprint platform 700 comprises a processor 710, such as one or more processing devices each including one or more processing cores, and/or one or more commercially available Central Processing Units ("CPUs") in the form of one-chip microprocessors, coupled to a communication device 720 configured to communicate via a communication network (not shown in FIG. 7). In some examples the processor is a multicore processor or a plurality of multicore processors. The processor may be fixed or reconfigurable. The communication device 720 may be used to communicate, for example, with one or more imagery sources, user platforms, other systems etc. The building footprint platform 700 further includes an input device 740 (e.g., a computer mouse and/or keyboard, other pointing device, keypad, a microphone, a knob or a switch, an infra-red (IR) port, a docking station, and/or a touch screen to input information) and/an output device 750 (e.g., a speaker, printer, and/or computer monitor to render a display, provide alerts, transmit recommendations, and/or create reports). The input/output devices may include an interface, a port, a cable, a bus, a board, a wire and the like. For example, data may be output to an embedded display of the ground point platform 700, an externally connected display, a display connected to the cloud, another device, and the like. According to some embodiments, a mobile device, monitoring physical system, and/or PC may be used to exchange information with the building footprint platform 700.

The processor 710 also communicates with a storage device 730. The storage device 730 may comprise any appropriate information storage device, including combinations of magnetic storage devices (e.g., a hard disk drive), optical storage devices, mobile telephones, and/or semiconductor memory devices. The storage device 730 may or may not be included within a database system, a cloud environment, a web server, or the like. The storage device 730 stores a program 712 and/or building footprint processing logic 714 for controlling the processor 710. The processor 710 performs instructions of the programs 712, 714, and thereby operates in accordance with any of the embodiments described herein. For example, the processor 710 may receive, from a plurality of imagery sources, color and height data for an AOI. The processor 710 may then perform a process to determine a building footprint in an AOI based on the color and height.

The programs 712, 714 may be stored in a compressed, uncompiled and/or encrypted format. The programs 712, 714 may furthermore include other program elements, such as an operating system, clipboard application, a database management system, and/or device drivers used by the processor 710 to interface with peripheral devices.

As used herein, information may be "received" by or "transmitted" to, for example: (i) the building footprint platform 700 from another device; or (ii) a software application or module within the building footprint platform 700 from another software application, module, or any other source.

All systems and processes discussed herein may be embodied in program code stored on one or more non-transitory computer-readable media. Such media may include, for example, a hard disk, a DVD-ROM, a Flash drive, magnetic tape, and solid-state Random Access Memory (RAM) or Read Only Memory (ROM) storage units. Embodiments are therefore not limited to any specific combination of hardware and software.

The following illustrates various additional embodiments of the invention. These do not constitute a definition of all possible embodiments, and those skilled in the art will understand that the present invention is applicable to many other embodiments. Further, although the following embodiments are briefly described for clarity, those skilled in the art will understand how to make any changes, if necessary, to the above-described apparatus and methods to accommodate these and other embodiments and applications.

Although specific hardware and data configurations have been described herein, note that any number of other configurations may be provided in accordance with embodiments of the present invention (e.g., some of the information associated with the databases described herein may be combined or stored in external systems). Moreover, note that some embodiments may be associated with a display of information to an operator.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims.

The invention claimed is:

1. A system comprising:
   an image data source storing image data from a plurality of images;
   a height map source storing height maps for areas of interest;
   a building footprint module;
   a memory storing program instructions; and
   a building footprint processor, coupled to the memory, and in communication with the building footprint module and operative to execute the program instructions to:
   receive image data for an area of interest (AOI);
   receive a height map for the AOI;
   execute a building segmentation module to generate a pixel-by-pixel building mask that indicates a presence of one or more buildings in the AOI;
   apply at least one clean mask process to the generated pixel-by-pixel building mask to generate a clean mask, wherein for each pixel in the pixel-by-pixel building mask, the clean mask process: confirms a pixel assignment in a case the pixel assignment matches a predicted pixel assignment, and changes the pixel assignment in a case the pixel assignment does not match the predicted pixel assignment, to generate the clean mask;
   receive the clean mask at an instance building segmentation module; and
   execute the instance building segmentation module to generate at least one building footprint based on the clean mask and the received image data.

2. The system of claim 1, further comprising program instructions to:
   assign a building identifier to each generated building footprint.

3. The system of claim 1, wherein the image data is data from multi-spectral images.

4. The system of claim 3, further comprising process steps to:
   extract red wavelengths, green wavelengths and blue wavelengths from the multi-spectral images to generate a red-green-blue (RGB) image.

5. The system of claim 1, wherein the pixel-by-pixel building mask is a binary label representation of each pixel in the image data as a building or non-building.

6. The system of claim 1, wherein the at least one clean mask process is a morphological operation, a small object removal filter, a small hole removal filter and a spectral analysis operation.

7. The system of claim 1, wherein the instance building segmentation module includes a direction neural network and a distance transform neural network.

8. The system of claim 7, wherein the instance building segmentation module is operative to predict whether each indicated building in the clean mask is one building or more than one building.

9. The system of claim 7, wherein each of the direction neural network and the distance transform neural network are convolutional neural networks.

10. The system of claim 7, wherein the direction neural network determines a direction to an edge of a building pixel group for each pixel in the building pixel group in the clean mask and generates a direction mask.

11. The system of claim 10, wherein the direction mask provides an indication of the direction of a nearest boundary.

12. The system of claim 10, wherein the distance transform neural network is operative to receive the direction mask and predict a distance from each pixel to the edge of the building pixel group.

13. A method comprising:
    receiving multi-spectral image data for an area of interest (AOI);
    receiving a height map for the AOI;
    executing a building segmentation module to generate a pixel-by-pixel building mask that indicates a presence of one or more buildings in the AOI;
    applying at least one clean mask process to the generated pixel-by-pixel building mask to generate a clean mask, wherein for each pixel in the pixel-by-pixel building mask, the clean mask process: confirms a pixel assignment in a case the pixel assignment matches a predicted pixel assignment, and changes the pixel assignment in a case the pixel assignment does not match the predicted pixel assignment, to generate the clean mask;
    receiving the clean mask at an instance building segmentation module; and
    executing the instance building segmentation module to generate at least one building footprint based on the clean mask and the received image data.

14. The method of claim 13, further comprising:
    assigning a building identifier to each generated building footprint.

15. The method of claim 13, further comprising:
    extracting red wavelengths, green wavelengths and blue wavelengths from the multi-spectral images to generate a red-green-blue (RGB) image.

16. The method of claim 13, wherein the instance building segmentation module includes a direction neural network and a distance transform neural network, wherein the instance building segmentation module is operative to predict whether each indicated building in the clean mask is one building or more than one building.

17. The method of claim 16, wherein the direction neural network determines a direction to an edge of a building pixel group for each pixel in the building pixel group in the clean mask and generates a direction mask.

18. A non-transient, computer-readable medium storing instructions to be executed by a processor to perform a method comprising:
    receiving multi-spectral image data for an area of interest (AOI);
    receiving a height map for the AOI;

executing a building segmentation module to generate a pixel-by-pixel building mask that indicates a presence of one or more buildings in the AOI;

applying at least one clean mask process to the generated pixel-by-pixel building mask to generate a clean mask, wherein for each pixel in the pixel-by-pixel building mask, the clean mask process: confirms a pixel assignment in a case the pixel assignment matches a predicted pixel assignment, and changes the pixel assignment in a case the pixel assignment does not match the predicted pixel assignment, to generate the clean mask;

receiving the clean mask at an instance building segmentation module; and executing the instance building segmentation module to generate at least one building footprint based on the clean mask and the received image data.

19. The medium of claim 18, further comprising:

assigning a building identifier to each generated building footprint.

20. The system of claim 1, further comprising program instructions to:

assign a label to pixels that are not marked in the pixel-by-pixel building mask, wherein the assignment is based on neighboring pixel areas.

* * * * *